(12) United States Patent
Kataoka et al.

(10) Patent No.: US 8,679,870 B2
(45) Date of Patent: Mar. 25, 2014

(54) METHOD OF MANUFACTURING SEMICONDUCTOR ELEMENT

(71) Applicant: Canon Kabushiki Kaisha, Tokyo (JP)

(72) Inventors: Ichiro Kataoka, Mobara (JP); Kazuya Igarashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/687,239

(22) Filed: Nov. 28, 2012

(65) Prior Publication Data

US 2013/0149802 A1    Jun. 13, 2013

(30) Foreign Application Priority Data

Dec. 12, 2011  (JP) ................................. 2011-270895

(51) Int. Cl.
*H01L 21/00*    (2006.01)
(52) U.S. Cl.
USPC .................. 438/26; 438/50; 438/73; 438/75; 438/458; 438/465
(58) Field of Classification Search
None
See application file for complete search history.

(56) References Cited

U.S. PATENT DOCUMENTS 6,762,508 B1   7/2004  Kiso et al. ..................... 257/787
6,841,454 B2 *  1/2005  Nishiyama ................... 438/458

FOREIGN PATENT DOCUMENTS

JP       2008-164980       7/2008

\* cited by examiner

*Primary Examiner* — Kyoung Lee
(74) *Attorney, Agent, or Firm* — Fitzpatrick, Cella, Harper & Scinto

(57) ABSTRACT

Provided is a method of manufacturing a semiconductor element having at a cut portion with excellent quality, which minimizes a region on a silicon substrate necessary for cutting, and which prevents cutting water used when cutting by dicing is carried out from entering the semiconductor element. The method of manufacturing a semiconductor element includes: arranging, on the silicon substrate, multiple semiconductor element portions so as to be adjacent to one another; bonding the silicon substrate and a glass substrate together using the resin; and cutting the silicon substrate and the glass substrate, respectively, in a region in which the resin is provided, the cutting the silicon substrate and the glass substrate including: half-cutting the silicon substrate by dicing; cutting the glass substrate by scribing; and dividing the silicon substrate, the glass substrate, and the resin.

3 Claims, 5 Drawing Sheets

PRESSURIZATION

METHOD OF MANUFACTURING SEMICONDUCTOR ELEMENT

BACKGROUND OF THE INVENTION

1. Field of the Invention

The present invention relates to a method of manufacturing a semiconductor element, and more particularly, to a method of manufacturing a semiconductor element formed by bonding a silicon substrate and a glass substrate.

2. Description of the Related Art

At present, as a display element mounted on a display device such as a display, a reflective liquid crystal display element (LCOS), an organic light emitting element (organic electroluminescence (EL) element), and the like are actively researched and developed. When an LCOS or an organic light emitting element is manufactured, there are cases in which a step of bonding together a substrate (for example, a silicon substrate) on which elements are provided and a sealing substrate such as a glass substrate using a resin as an adhesive, that is, a sealing step, is included.

In the case of an LCOS, in the above-mentioned sealing step, not only the silicon substrate and the glass substrate are bonded together, but also a space between the silicon substrate and the glass substrate is filled with a liquid crystal material. Specifically, the silicon substrate and the glass substrate are bonded together using a resin sealing material provided at peripheral portions of each of the substrates, and a space between the two substrates and inside the resin seal material is filled with the liquid crystal material. In the case of an organic EL element, the above-mentioned sealing step is carried out for the purpose of blocking the organic EL element from outside air. Specifically, the silicon substrate (substrate) and the glass substrate (sealing substrate) are bonded together using a filling resin so as to cover at least the entire surface of a light emitting region, and the organic light emitting element is enclosed with the silicon substrate, the glass substrate, and the filling resin to protect the organic light emitting element from oxygen and moisture in the atmosphere.

By the way, when a semiconductor element is manufactured, from the viewpoint of production efficiency, a mother board on which multiple semiconductor elements are arranged is used. When such a mother board is used to manufacture a semiconductor element, the semiconductor element is manufactured specifically through the following steps (a) to (c): (a) a step of manufacturing multiple semiconductor elements on the mother board; (b) a step of bonding together and integrating the mother board and a glass substrate (sealing substrate) having substantially the same the size as the mother board using a resin, thereby sealing all the semiconductor elements provided on the mother board; and (c) a step of separating the semiconductor elements one by one by cutting the mother board and the glass substrate.

By the way, as a method of dividing a structure formed by bonding together a silicon substrate as a mother board and a glass substrate as a sealing substrate using a resin, for example, there is known collective cutting of the silicon substrate, the glass substrate, and the resin by dicing.

In this case, when the silicon substrate, the glass substrate, and the resin are simultaneously cut by dicing, clogging occurs because a dicing blade used strikes the resin. This clogging conspicuously reduces the dicing quality (in particular, increases chippings). Therefore, in order to maintain the dicing quality at a certain level, it is necessary to increase the replacement frequency of the dicing blade. Further, generally, the thickness of a dicing blade which can cut both silicon and glass is larger than the thickness of a dicing blade used only for silicon. Therefore, a region on the silicon substrate which is necessary for cutting the silicon substrate (cutting street) becomes larger, which results in the reduced number of semiconductor elements taken from one mother board.

Further, when dicing is carried out at a portion in which there is no resin between the silicon substrate and the glass substrate, a problem may arise that cutting water used in the dicing enters together with particles to contaminate the elements provided on the silicon substrate with the particles.

As a method of solving the above-mentioned problem which arises when a substrate is cut, Japanese Patent Application Laid-Open No. 2008-164980 proposes a method in which, when the silicon substrate and the glass substrate are cut at a portion having the resin therebetween, the cutting method is changed. Specifically, there is proposed a method in which, while the glass substrate and the resin are completely cut by dicing, the silicon substrate is half-cut by dicing.

However, even the method proposed in Japanese Patent Application Laid-Open No. 2008-164980 still cuts the resin itself by dicing, and, similarly to the case of the conventional art, the above-mentioned reduction of the dicing quality is inevitable. Further, in order to completely cut the glass substrate and the resin by dicing, it is necessary to dice to some extent an interface of the silicon substrate with the resin, and the above-mentioned dicing blade which can cut both silicon and glass is required to be used. Further, when a part of the cut portion does not include the resin therein, cutting water enters the portion which does not include the resin therein.

SUMMARY OF THE INVENTION

The present invention has been made in view of the above-mentioned problems. An object of the present invention is to provide a method of manufacturing a semiconductor element having a cut portion with excellent quality, which minimizes a region on a silicon substrate necessary for cutting, and which prevents cutting water used when cutting by dicing is carried out from entering the semiconductor element.

According to an exemplary embodiment of the present invention, there is provided a method of manufacturing a semiconductor element, the semiconductor element including: a silicon substrate; a semiconductor element portion provided on the silicon substrate; and a sealing member for sealing the semiconductor element portion, the sealing member including a glass substrate provided so as to be opposed to a surface of the silicon substrate having the semiconductor element portion provided thereon, and a resin for bonding the silicon substrate and the glass substrate, the method including: arranging, on the silicon substrate, multiple semiconductor element portions so as to be adjacent to one another; bonding the silicon substrate and the glass substrate together using the resin; and cutting the silicon substrate and the glass substrate, respectively, in a region in which the resin is provided, the cutting the silicon substrate and the glass substrate including: half-cutting the silicon substrate by dicing; cutting the glass substrate by scribing; and dividing the silicon substrate, the glass substrate, and the resin after the dicing and the scribing are carried out, in which an amount of remainder of half-cut in the half-cutting the silicon substrate is 20 µm or more and 100 µm or less.

According to the present invention, it is possible to provide the method of manufacturing a semiconductor element having a cut portion with excellent quality, which minimizes the region on the silicon substrate necessary for cutting, and which prevents the cutting water used when cutting by dicing is carried out from entering the semiconductor element.

Specifically, according to the method of manufacturing a semiconductor element of the present invention, the resin is not diced, and thus, clogging of a dicing blade with the resin does not occur, and the quality of a cut portion becomes excellent, and, in particular, chippings of the silicon substrate can be reduced.

Further, according to the method of manufacturing a semiconductor element of the present invention, in dicing, a dicing blade used only for the silicon substrate can be used, and thus, a thin blade can be used. Therefore, a region on the silicon substrate, which is necessary for cutting, can be minimized.

Still further, in dicing, even when the silicon substrate is cut in a region without the resin, the cutting water used in dicing does not enter a space between the silicon substrate and the glass substrate, and thus, it is not necessary to change the cutting method between a portion with the resin and a portion without the resin. Accordingly, the steps can be simplified.

Further features of the present invention will become apparent from the following description of exemplary embodiments with reference to the attached drawings.

DESCRIPTION OF THE EMBODIMENTS

A manufacturing method according to the present invention is a method of manufacturing a semiconductor element including: a silicon substrate; a semiconductor element portion provided on the silicon substrate; and a sealing member for sealing the semiconductor element portion.

Further, according to the present invention, the sealing member includes a glass substrate provided so as to be opposed to a surface of the silicon substrate having the semiconductor element portion provided thereon, and a resin for bonding the silicon substrate and the glass substrate.

The method of manufacturing a semiconductor element according to the present invention includes the following steps (1) to (3): (1) a step of arranging on the silicon substrate multiple semiconductor element portions so as to be adjacent to one another (semiconductor element portion forming step); (2) a step of bonding the silicon substrate and the glass substrate together using the resin (bonding step); and (3) a step of cutting the silicon substrate and the glass substrate in a region in which the resin is provided (substrate cutting step).

Further, according to the present invention, the above-mentioned substrate cutting step (3) includes the following steps (3-1) to (3-3): (3-1) a step of half-cutting the silicon substrate by dicing; (3-2) a step of cutting the glass substrate by scribing; and (3-3) a step of dividing the silicon substrate, the glass substrate, and the resin after the dicing and the scribing are carried out.

Note that, according to the present invention, it is preferred to, after carrying out the step (3-1), divide the silicon substrate, and then carry out the step (3-2).

A semiconductor element manufactured by the manufacturing method according to the present invention refers to an electronic element having a member formed of an inorganic semiconductor or an organic semiconductor. Further, the semiconductor element includes as a matter of course an electronic element having a member formed of an inorganic semiconductor and a member formed of an organic semiconductor, and an electronic element having a member formed by combining an inorganic semiconductor and an organic semiconductor. Specifically, an organic light emitting element, an LCOS, and the like are included.

The method of manufacturing a semiconductor element according to the present invention is described in the following by means of embodiments with appropriate reference to the attached drawings. Note that, the embodiments of the present invention described in the following are merely exemplary, and the present invention is not limited thereto and various applications and modifications are possible within the above-mentioned gist of the present invention.

Embodiment 1

Figure 1:
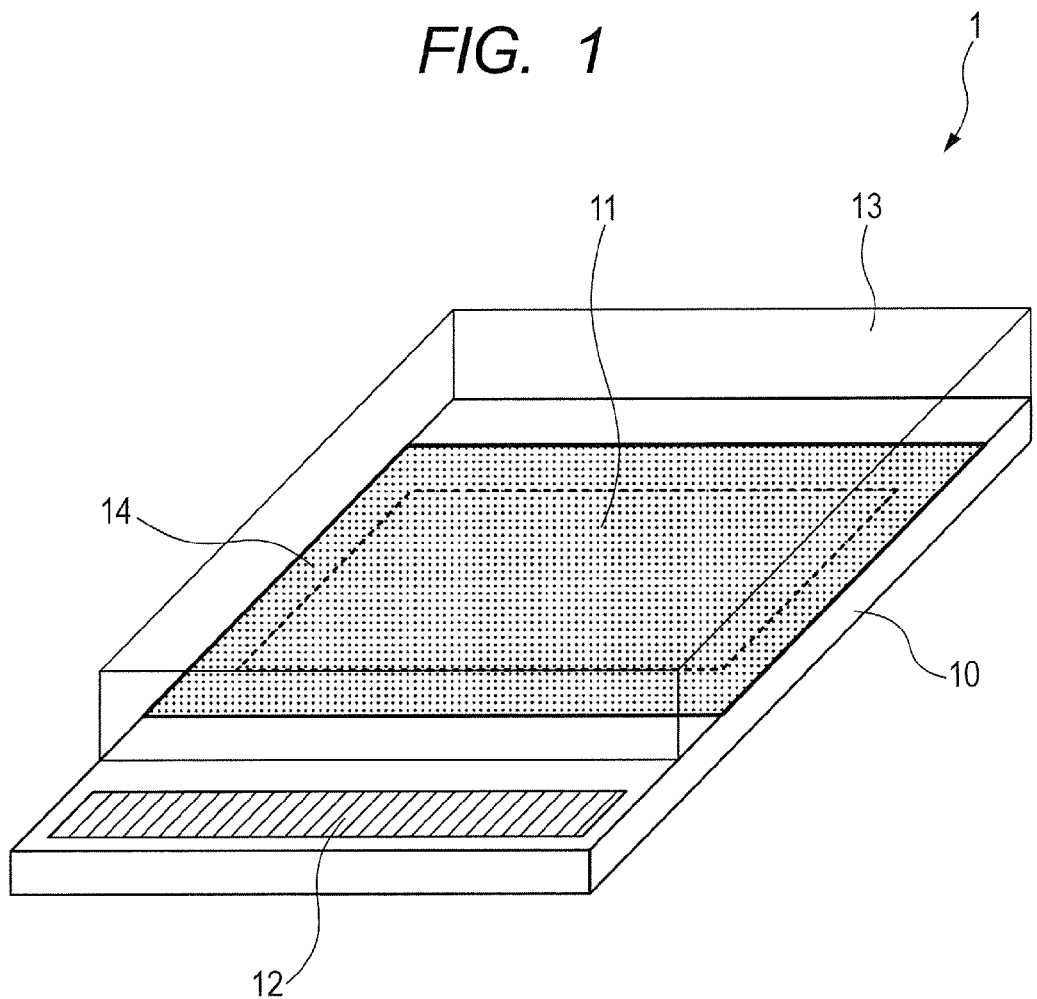
FIG. 1 is a perspective view illustrating an exemplary semiconductor element manufactured by a method of manufacturing a semiconductor element according to the present invention.

FIG. 1 is a perspective view illustrating an exemplary semiconductor element manufactured by a method of manufacturing a semiconductor element according to the present invention. Note that, an exemplary semiconductor element 1 illustrated in FIG. 1 is, for example, an organic light emitting element, but the present invention is not limited thereto.

The semiconductor element 1 illustrated in FIG. 1 includes a silicon substrate 10, a display portion 11 provided on the silicon substrate 10 in the center of the silicon substrate 10, and an electrode pad 12 provided on the silicon substrate 10 along an edge on one side of the silicon substrate 10.

Further, in the semiconductor element 1 illustrated in FIG. 1, the display portion 11 is sealed by a glass substrate 13 and a resin 14. Note that, according to the present invention, to "seal" as used herein means, for example, to bond the silicon substrate 10 and the glass substrate 13 together after the resin 14 is applied onto the display portion 11 and onto the silicon substrate 10 around the display portion 11, as illustrated in FIG. 1. However, in the present invention, the specific form of the sealing is not limited to the one illustrated in FIG. 1. For example, the silicon substrate 10 and the glass substrate 13 may be bonded together after the resin 14 is selectively applied only onto the silicon substrate 10 around the display portion 11 under an atmosphere of an inert gas such as a nitrogen gas. In other words, the resin 14 used in the sealing is not necessarily required to be applied onto the display portion 11.

On the other hand, in the semiconductor element 1 illustrated in FIG. 1, the electrode pad 12 is connected to wiring from the outside using wire bonding or the like. Therefore, the glass substrate 13 as a sealing member is required to be removed from the electrode pad 12 if possible, and thus, it is necessary not to provide the resin 14 on the electrode pad 12.

By the way, when the multiple semiconductor elements 1 illustrated in FIG. 1 are manufactured, from the viewpoint of production efficiency, there is adopted a method in which multiple display portions are formed on a large-sized silicon substrate (mother board), the respective display portions are sealed using the glass substrate and the resin, and then, cutting is carried out to separate the respective elements one by one.

Figure 2:
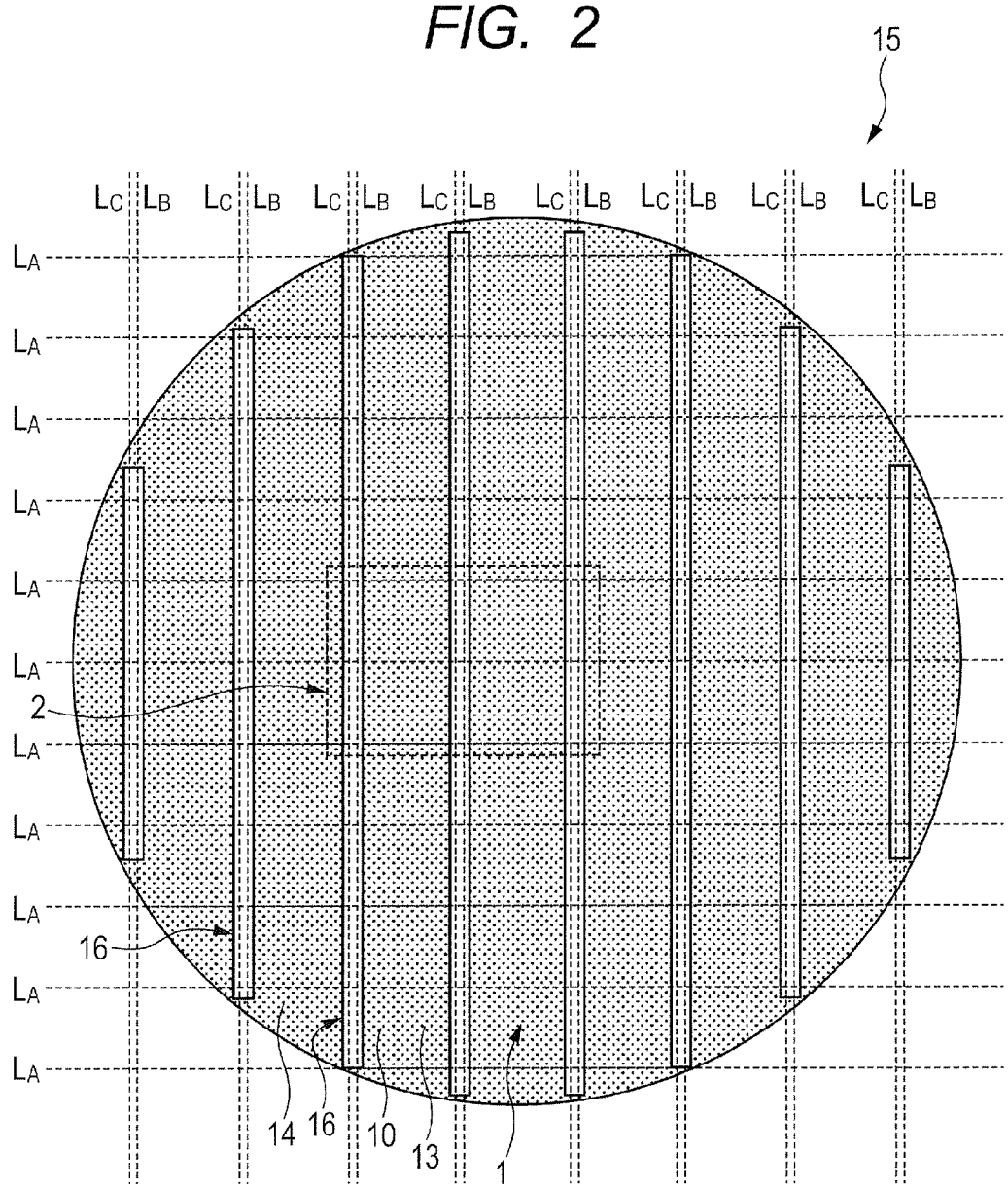
FIG. 2 is a schematic plan view illustrating a specific example of a bonded substrate used when the semiconductor element illustrated in FIG. 1 is manufactured.

FIG. 2 is a schematic plan view illustrating a specific example of a bonded substrate used when the semiconductor element illustrated in FIG. 1 is manufactured. Note that, in FIG. 2, like reference numerals are used to designate like members in the semiconductor element illustrated in FIG. 1. A bonded substrate 15 illustrated in FIG. 2 includes the silicon substrate 10 which is circular, the glass substrate 13 in the same shape as that of the silicon substrate 10, and the resin 14 for bonding the silicon substrate 10 and the glass substrate 13 together. Further, on the silicon substrate 10 illustrated in FIG. 2, the multiple display portions (not shown) and the multiple electrode pads (not shown) forming the semiconductor elements illustrated in FIG. 1 are respectively provided in predetermined regions. By the way, in the bonded substrate 15 illustrated in FIG. 2, the resin 14 is not applied onto the entire surface of the silicon substrate 10, but is applied so as to avoid the electrode pads (not shown) forming the semiconductor elements illustrated in FIG. 1, and regions therearound, specifically, so as to avoid regions 16. By limiting the application regions of the resin 14 in this way, the resin 14 is prevented from being applied onto the electrode pads 12 forming the semiconductor elements 1 illustrated in FIG. 1.

Next, steps of manufacturing the semiconductor element 1 illustrated in FIG. 1 through the manufacture of the bonded substrate 15 illustrated in FIG. 2 are described.

(1) Semiconductor Element Portion Forming Step

First, multiple semiconductor element portions are arranged on the silicon substrate 10 so as to be adjacent to one another. The semiconductor element portion as used herein refers to a group of members such as the display portion 11 and the electrode pad 12 which form the semiconductor element illustrated in FIG. 1 and which are formed on the silicon substrate 10. Further, by providing multiple semiconductor element portions in which structural members and arrangement thereof are the same with cutting lines $L_A$ and $L_B$ described below being boundary lines, the multiple semiconductor element portions provided on the silicon substrate 10 are arranged so as to be adjacent to one another.

(2) Bonding Step

Next, the silicon substrate 10 and the glass substrate 13 are bonded together using the resin 14. The method of bonding the silicon substrate 10 and the glass substrate 13 together is not specifically limited. However, as described above, after the resin 14 is applied so as to avoid the electrode pads (not shown) forming the semiconductor elements, and regions therearound, the silicon substrate 10 and the glass substrate 13 are bonded together.

In this step, it is preferred to use a resin which is cured after the silicon substrate 10 and the glass substrate 13 are bonded together because division of the substrates in the subsequent step can be carried out easily. Exemplary preferred resins used in the present step (bonding step) include a thermosetting epoxy resin, a thermosetting acrylic resin, an ultraviolet curable epoxy resin, and an ultraviolet curable acrylic resin.

(3) Substrate Cutting Step

Next, the silicon substrate and the glass substrate are respectively cut in regions in which the resin is provided. In this case, when the silicon substrate and the glass substrate are cut, the silicon substrate 10, the glass substrate 13, or the resin 14 is cut along, for example, three kinds of cutting lines illustrated in FIG. 2, that is, $L_A$, $L_B$, and $L_C$. Specifically, the silicon substrate 10, the glass substrate 13, and the resin 14 are cut along the cutting line $L_A$. The silicon substrate 10 and the glass substrate 13 are cut along the cutting line $L_B$. Further, only the glass substrate 13 is cut along the cutting line $L_C$. In this way, at least 54 semiconductor elements 1 are obtained from the bonded substrate 15 illustrated in FIG. 2. Further, the silicon substrate and the glass substrate are cut in regions in which the resin 14 is provided, and thus, there is a reduced possibility that the display portion (not shown in FIG. 2) sealed by the glass substrate 13 and the resin 14 and included in the semiconductor element is exposed when the silicon substrate or the glass substrate is cut.

Figure 3:
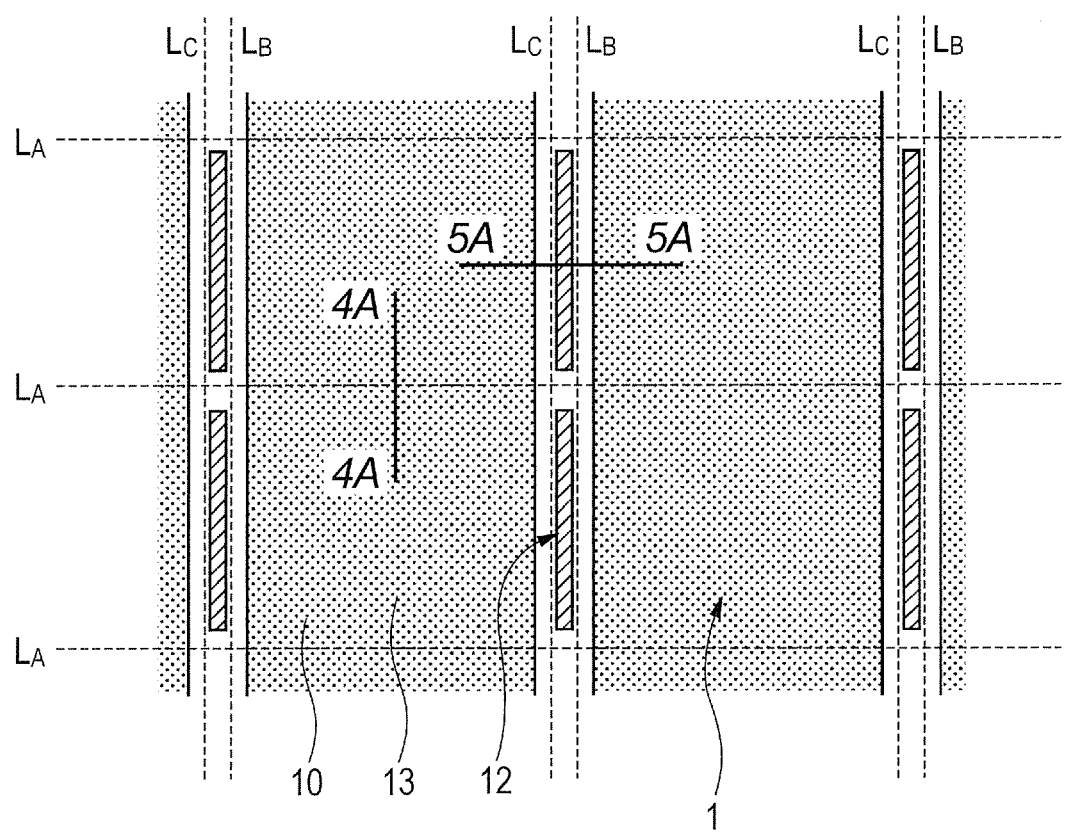
FIG. 3 is a partial enlarged view illustrating a region surrounded by the broken lines in FIG. 2.
Figure 4A:
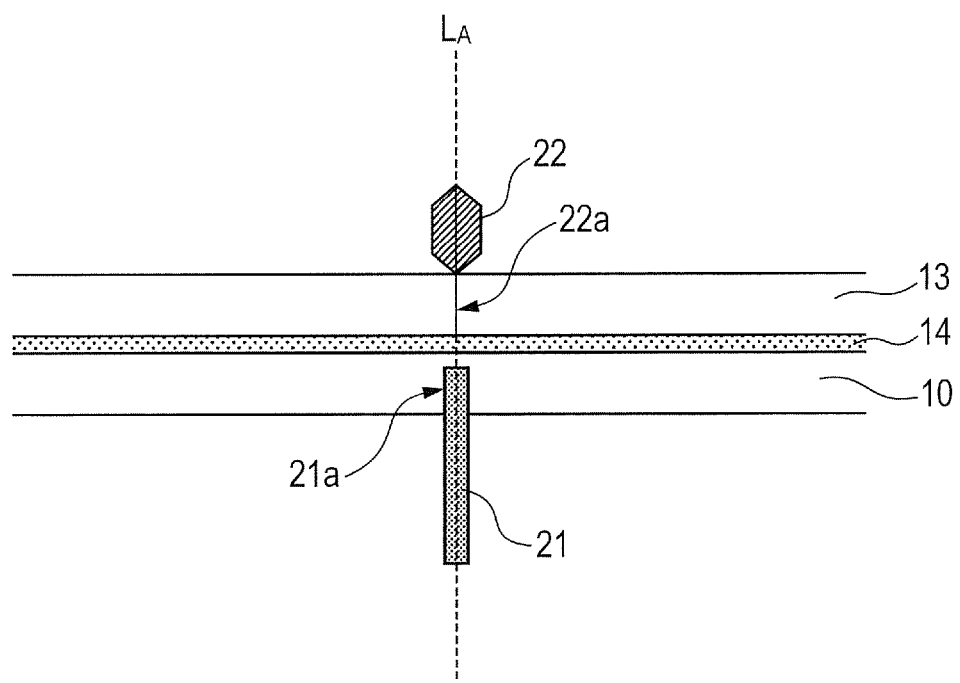
FIG. 4A is a schematic sectional view taken along the line 4A-4A of FIG. 3.
Figure 4B:
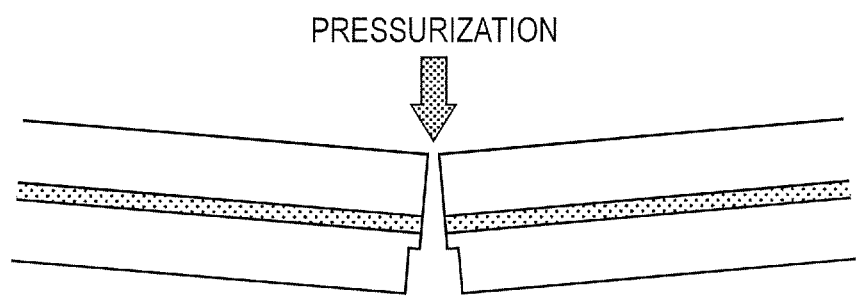
FIG. 4B is a schematic sectional view illustrating a state after cutting.
Figure 5A:
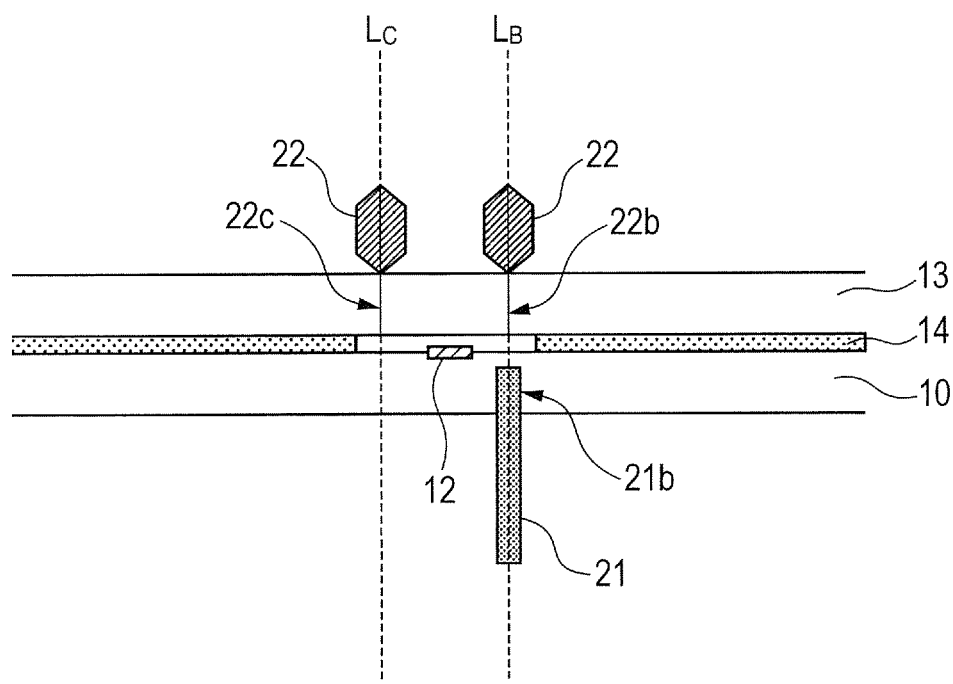
FIG. 5A is a schematic sectional view taken along the line 5A-5A of FIG. 3.
Figure 5B:
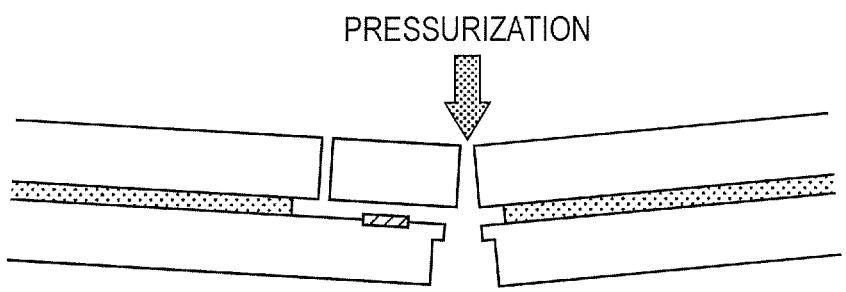
FIG. 5B is a schematic sectional view illustrating a state after the cutting.

A specific method of cutting the silicon substrate and the glass substrate is now described in detail with appropriate reference to the attached drawings. FIG. 3 is a partial enlarged view illustrating a region surrounded by broken lines in FIG. 2 (designated by a reference numeral 2). FIG. 4A is a schematic sectional view taken along the line 4A-4A of FIG. 3, and FIG. 4B is a schematic sectional view illustrating a state after the cutting. Further, FIG. 5A is a schematic sectional view taken along the line 5A-5A of FIG. 3, and FIG. 5B is a schematic sectional view illustrating a state after the cutting.

Further, according to the present invention, the above-mentioned substrate cutting step (3) includes the following steps (3-1) to (3-3): (3-1) a step of half-cutting the silicon substrate by dicing; (3-2) a step of cutting the glass substrate by scribing; and (3-3) a step of dividing the silicon substrate, the glass substrate, and the resin, which are included in the bonded substrate, after the dicing and the scribing are carried out.

In this embodiment, the silicon substrate is half-cut by dicing along the cutting lines $L_A$ and $L_B$ illustrated in FIG. 3. Note that, dicing is carried out with respect to a surface which is opposite to a surface opposed to the glass substrate 13 of the two surfaces of the silicon substrate 10.

When the silicon substrate 10 is half-cut by dicing, the depth of the half cut of the silicon substrate 10 is not specifically limited insofar as the depth enables the silicon substrate 10 to be divided when stress is applied thereto. However, a diagonal crack may develop in the silicon substrate when divided (broken), and thus, in order to enhance the positional accuracy of the division, it is preferred to cause the depth of the half-cut of the silicon substrate 10 to be as large as possible. An experiment was conducted on the relationship between the depth of the half-cut, the division accuracy, and the division quality. The results are shown in Table 1.

TABLE 1

| Amount of remainder of half-cut | Chipping | Positional fluctuation of division |
| --- | --- | --- |
| 20 μm | OK | ±20 μm |
| 50 μm | OK | ±50 μm |
| 75 μm | OK | ±75 μm |
| 100 μm | OK | ±100 μm |
| 150 μm | NG | ±200 μm |

For example, it can be found that, when the amount of remainder of the half-cut which is the thickness of the silicon substrate 10 minus the depth of the half-cut of the silicon substrate 10 is 20 μm or more and 100 μm or less, chippings are not generated, and hence this case is preferred. Further, it is more preferred that the amount of remainder of the half-cut be 20 μm or more and 75 μm or less because the division accuracy can be high. When the amount of remainder of the half-cut is more than 100 μm, it becomes difficult to divide the silicon substrate 10. When the division is performed by force, chippings are generated, and at the same time, the positional fluctuations of the division become large. Therefore, the cutting street may become larger. On the other hand, when the amount of remainder of the half-cut is less than 20 μm, the silicon substrate 10 is easily broken in dicing or when the substrate is handled, and the division cannot be controlled.

When the silicon substrate 10 is half-cut by dicing as illustrated in FIG. 4A and FIG. 5A, it is desired that the thickness of a dicing blade 21 used be as small as possible for the purpose of inhibiting the chippings and minimizing the region on the silicon substrate 10 which is necessary for the cutting. However, when the thickness of the dicing blade 21 is too small, the durability of the blade itself is insufficient, which may become a cause of breakage of the blade when dicing is carried out. The thickness of the dicing blade 21 used according to the present invention is preferably 15 μm or more and 60 μm or less, and more preferably, 25 μm or more and 50 μm or less.

For example, when the dicing blade 21 having a thickness of 34 μm is used, it is possible to cause the width of the cutting region of the silicon substrate 10 including the chippings to be 70 μm or less.

In this embodiment, the glass substrate 13 is cut by a scriber 22 illustrated in FIG. 4A and FIG. 5A along the cutting lines $L_A$, $L_B$, and $L_C$ illustrated in FIG. 3. In this case, when the glass substrate is cut by the scriber 22, it is desired to develop a vertical crack caused by the scriber 22 as deep as possible. For example, by using a scribing wheel Penett (trademark) manufactured by Mitsuboshi Diamond Industrial Co., Ltd., a vertical crack can be developed as deep as possible. Note that, scribing of the glass substrate 13 along the cutting line $L_C$ may be carried out before the glass substrate 13 is divided along the cutting lines $L_A$ and $L_B$, or after the division.

After half-cutting of the silicon substrate 10 and cutting of the glass substrate 13 are carried out, the silicon substrate 10, the glass substrate 13, and the resin 14 are divided along the half-cut places (21a and 21b) or along the cut places (22a, 22b, and 22c). Specifically, as illustrated in FIG. 4B and FIG. 5B, by pressurization from the glass substrate 13 side (toward the silicon substrate 10) along the cutting lines ($L_A$ and $L_B$), stress is applied in a direction in which a groove formed by half-cutting the silicon substrate 10 expands. This pressurization enables division of the silicon substrate 10, the glass substrate 13, and the resin 14 under a state in which chippings of the silicon substrate 10 are inhibited.

In this embodiment, processing shown in Table 2 below is carried out along the cutting lines ($L_A$, $L_B$, and $L_C$). The silicon substrate 10, the glass substrate 13, or the resin 14 is divided along the cutting lines.

TABLE 2

|  | Processing | Member to be divided |
|---|---|---|
| Cutting line $L_A$ | Dicing | Silicon substrate 10 |
|  | Scribing | Glass substrate 13 |
|  |  | Resin 14 |
| Cutting line $L_B$ | Dicing | Silicon substrate 10 |
|  | Scribing | Glass substrate 13 |
| Cutting line $L_C$ | Scribing | Glass substrate 13 |

Through the steps described above, a semiconductor element having a cut portion with excellent quality illustrated in FIG. 1 can be manufactured.

Embodiment 2

In this embodiment, a semiconductor element is manufactured in a way similar to that of Embodiment 1 except that, after the silicon substrate is half-cut by dicing, the silicon substrate 10 is divided, and then the glass substrate is cut by scribing. Specifically, after the silicon substrate is half-cut by dicing, stress is applied in a direction in which a groove formed by half-cutting expands, to thereby develop a crack in a thickness direction in a part of the silicon substrate 10 which is not subjected to the half-cutting and divide the silicon substrate 10. After that, the glass substrate 13 is scribed. Other points are similar to those of Embodiment 1.

As described above, by dividing the silicon substrate 10 before the scribing, chippings of the silicon substrate 10 can be further inhibited. Therefore, a semiconductor element having a cut portion with more excellent quality can be obtained.

As described above, according to the present invention, it is possible to manufacture a semiconductor element, such as an organic EL display element, which has a cut portion with more excellent quality as compared with a conventional one. "Having a cut portion with excellent quality" as used herein specifically means that, for example, chippings of the silicon substrate are inhibited, a region on the silicon substrate which is necessary for the cutting is reduced, cutting water is prevented from entering into a space between the silicon substrate and the glass substrate in dicing, and the positional accuracy of dividing the glass substrate is improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-270895, filed Dec. 12, 2011, which is hereby incorporated by reference herein in its entirety.

What is claimed is:

1. A method of manufacturing a semiconductor element, the semiconductor element comprising:
    a silicon substrate;
    a semiconductor element portion provided on the silicon substrate; and
    a sealing member for sealing the semiconductor element portion,
    the sealing member comprising a glass substrate provided so as to be opposed to a surface of the silicon substrate having the semiconductor element portion provided thereon, and a resin for bonding the silicon substrate and the glass substrate,
the method comprising:
arranging, on the silicon substrate, multiple semiconductor element portions so as to be adjacent to one another;
bonding the silicon substrate and the glass substrate together using the resin; and
cutting the silicon substrate and the glass substrate, respectively, in a region in which the resin is provided,
    the cutting the silicon substrate and the glass substrate comprising:
        half-cutting the silicon substrate by dicing;
        cutting the glass substrate by scribing; and
        dividing the silicon substrate, the glass substrate, and the resin after the dicing and the scribing are carried out,
wherein an amount of remainder of half-cut in the half-cutting the silicon substrate is 20 μm or more and 100 μm or less.

2. The method according to claim 1, further comprising dividing, after the half-cutting the silicon substrate, the silicon substrate, and then cutting the glass substrate.

3. The method according to claim 1, wherein the semiconductor element comprises an organic electroluminescence element.

* * * * *